United States Patent [19]

Nishihara et al.

[11] Patent Number: 5,639,990
[45] Date of Patent: Jun. 17, 1997

[54] SOLID PRINTED SUBSTRATE AND ELECTRONIC CIRCUIT PACKAGE USING THE SAME

[75] Inventors: Kunio Nishihara; Youichi Hosono; Kunihiro Nagamine; Takashi Kayama; Takayuki Ishikawa, all of Kanagawa, Japan

[73] Assignee: Mitsui Toatsu Chemicals, Inc., Tokyo, Japan

[21] Appl. No.: 185,897

[22] PCT Filed: Jun. 4, 1993

[86] PCT No.: PCT/JP93/00756

§ 371 Date: Jan. 26, 1994

§ 102(e) Date: Jan. 26, 1994

[87] PCT Pub. No.: WO93/26142

PCT Pub. Date: Dec. 23, 1993

[30] Foreign Application Priority Data

Jun. 5, 1992 [JP] Japan ................................. 4-145617
Jun. 5, 1992 [JP] Japan ................................. 4-145618
Jun. 5, 1992 [JP] Japan ................................. 4-145619

[51] Int. Cl.⁶ ............................ H01L 23/28; H01L 21/56; H05K 1/18; H01R 9/00
[52] U.S. Cl. ...................... 174/52.2; 257/788; 257/709; 257/730; 361/760; 361/762; 361/772; 361/792; 361/795; 29/854; 29/856; 437/211; 437/225
[58] Field of Search .................... 174/52.1–52.4; 257/678, 700, 708, 723, 709, 724, 725, 730, 699, 701, 702, 703, 731, 732, 787, 788, 792; 361/820, 760–764, 792–795, 772; 29/854–856; 437/211, 225

[56] References Cited

U.S. PATENT DOCUMENTS 4,445,274  5/1984  Suzuki et al. ........................... 29/832
4,544,989  10/1985  Nakabu et al. ........................ 361/401
4,953,173  8/1990  Fujitsu ................................ 174/524 X
5,216,280  6/1993  Tanaka et al. .......................... 257/734
5,352,925  10/1994  Sudoh et al. ........................... 257/659

FOREIGN PATENT DOCUMENTS 0092019   10/1983  European Pat. Off. .
0352429   1/1990   European Pat. Off. .
56-44033  10/1981  Japan .
58-180088 10/1983  Japan .
59-8394   1/1984   Japan .
63-21860  1/1988   Japan .

(List continued on next page.)

OTHER PUBLICATIONS

Carlyon, "Molding, Fabricating, and Decorating," *Machine Design* vol. 40, No. 29, Dec. 12, 1968, p. 17.
Todd et al., "Polyimides", *Machine Design*, vol. 40, No. 29, Dec. 12, 1968, pp. 71–73.

*Primary Examiner*—Bot L. Ledynh
*Attorney, Agent, or Firm*—Burns, Doane, Swecker & Mathis

[57] ABSTRACT

The present invention relates to a solid printed substrate to be used for mounting electronic parts and a method of manufacturing the same. A metal base substrate having a plurality of copper foil layers stacked thereon is employed placing a thermoplastic polyimide sheet between each copper foil. The metal base substrate with a circuit pattern prepared on each copper foil layer is processed by bending or deep drawing into a box-shaped work which has an opening surface. The opening surface is processed so as to have a substantially equal area with that of the bottom of the substrate and have a collar portion on the periphery thereof. On the collar portion, leads to be used for connection with other wiring substrate are formed by patterning on copper foil layers. Mounting the solid printed substrate on other wiring substrate with the opening surface downwardly oriented, the leads and corresponding circuit patterns of the other wiring substrate are then soldered to finish the mounting of the solid printed substrate on the other wiring substrate. Therefore, by mounting electronic parts on the bottom of the solid printed substrate, an electronic circuit package can be constructed.

11 Claims, 8 Drawing Sheets

FOREIGN PATENT DOCUMENTS

| | | |
|---|---|---|
| 1-132147 | 5/1989 | Japan . |
| 1-43473 | 9/1989 | Japan . |
| 2-98188 | 4/1990 | Japan . |
| 4-6893 | 1/1992 | Japan . |
| 2010013 | 6/1979 | United Kingdom . |
| 2026234 | 1/1980 | United Kingdom . |
| 2202675 | 9/1988 | United Kingdom . |
| 9202040 | 2/1992 | WIPO . |

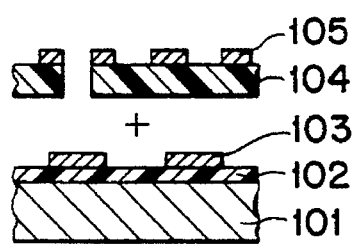
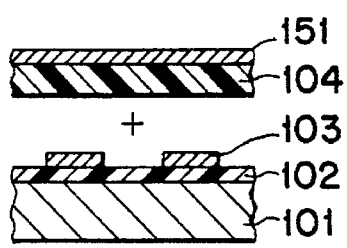
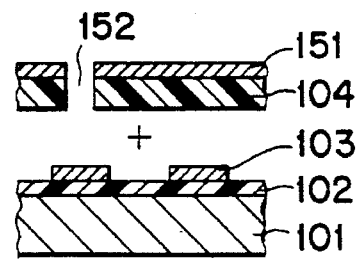
FIG. 3A          FIG. 3B          FIG. 3C
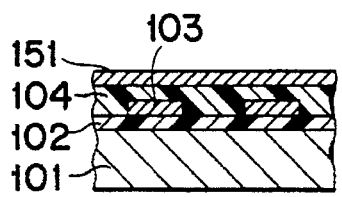
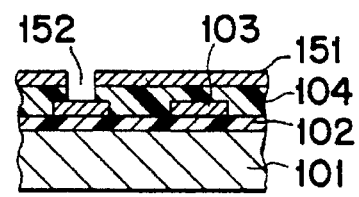
FIG. 3D          FIG. 3E
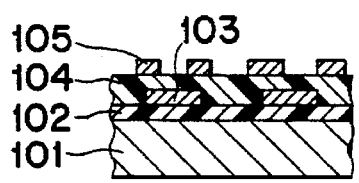
FIG. 3F
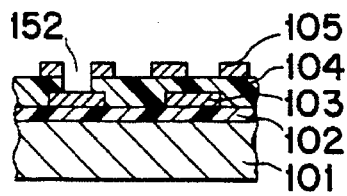
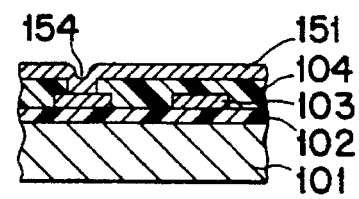
FIG. 3G          FIG. 3I
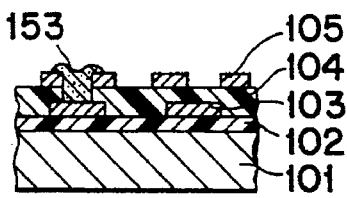
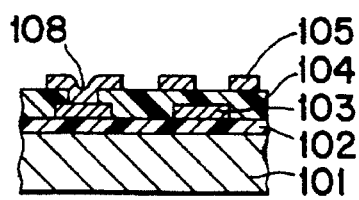
FIG. 3H          FIG. 3J FIG. 5
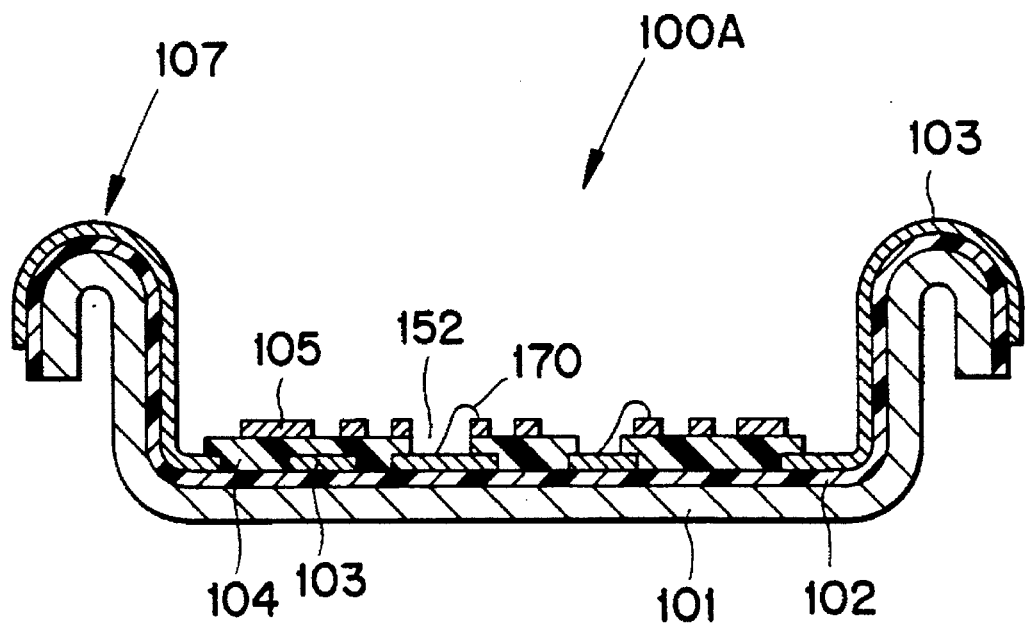
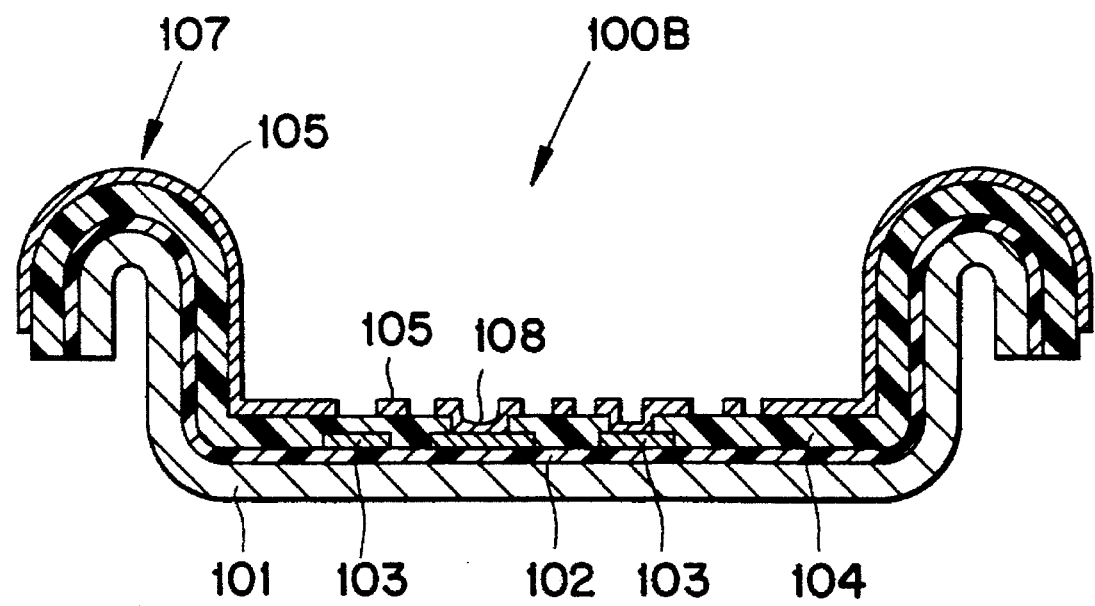
FIG. 6

SOLID PRINTED SUBSTRATE AND ELECTRONIC CIRCUIT PACKAGE USING THE SAME

DESCRIPTION

A solid printed substrate, an electronic circuit package using the solid printed substrate, and a method of manufacturing the printed substrate

TECHNICAL FIELD

The present invention relates to a solid printed substrate to be used for mounting electronic parts and a method of manufacturing the same, in particular, to a solid printed substrate using a metal base substrate and a method of manufacturing the same.

BACKGROUND ART

With the advance of miniaturization or the increase of operation speed of electronic equipment, high density packaging or high speed operation of electronic circuits to be mounted on the electronic equipment has been promoted to meet the situation. Since electronic parts constituting the electronic circuits are less spaced to each other in the high density packaging, particularly with the circuit of high operative frequency, error motion of the electronic circuit due to the unwanted radiation generated from each of electronic parts becomes a subject of discussion. In order to protect the electronic circuit from the unwanted radiation or to reduce the unwanted radiation which may affects the circuit, it is required to provide measures for shielding the circuit from electromagnetic waves. Also, since power consumption generally increases in high speed operation resulting In increase of the heating value of electronic parts, packaging of the electronic parts is required to have a good heat dispersion property.

The present inventor et al. have disclosed an electronic circuit package, in the Japanese Patent Laid-open Hei4-6893 (JP, A, 4-6893) Gazette, which allows high density packaging comprising a shielding characteristic for the electromagnetic waves while having a good heat dispersion property. This electronic circuit package is made of the metal base substrate through bending or drawing operation into a soup saucer shape. By disposing the electronic circuit package on another wiring substrate with its metal base substrate side up and the opening side down in order to Joint the opening side with the wiring substrate, the unwanted radiation to be leaked from the inside of the electronic circuit package is reduced while facilitating easy dispersion of heat. Since the electronic circuit package consists of only a single layer wiring conductor formed on the metal board having an insulation layer therebetween, It is unable to sufficiently meet the case in which multiple electronic parts are mounted with requirement of high density wiring. Since it is a metal base substrate, it cannot be expected to produce a multilayer substrate by merely using the through-hole plating technique. In addition, since this electronic circuit package is formed by shallow drawing, its external size tends to become much larger when compared with its effective inside measurement. Because of this, the electronic circuit package requires an extra space when it is mounted on the other substrate thereby making it difficult to realize high density packaging.

A QFP (Quad Flat Package), DIP (Dual Inline Package) or the like has been previously known as the representative package on which electronic parts are mounted. Lead frames are used as chip carriers to be used in these packages. Recently, applicable multiple-pin type electronic parts have increased in number, and lead frames for mounting these multiple-pin type electronic parts are required to have inner and outer leads with narrower pitch distances. While, since the outer leads are formed separately outwardly projecting from the package, It is difficult to narrow the pitch distance less than some extent in order to maintain the positional precision in packaging. As to inner leads, it is also difficult to form with certainty the portion which is adjacent to each of the electronic parts when the pitch distance is too narrowed. Therefore, it is estimated difficult to produce the package of the size smaller than the present one.

In order to meet these problems which are caused when lead frames are used, Japanese Patent Laid-open Hei1-132147 (JP, A, 1-132147) Gazette filed by Fujitsu (U.S. Pat. No. 4,953,173 Specification) discloses the package in which aluminum or copper is used as a base metal, a resin layer consisting of epoxy resin of several tens of micro meter thick is provided thereon as an insulation layer, subsequently copper foil is laminated, and after patterning thereof, a bend is formed by pressing. This package has electronic parts mounted on the center portion thereof using Its periphery as the outer leads. By composing the package in this way, it becomes possible to produce a minutely structured lead portion while keeping stability and at the same time it becomes possible to improve the heat dispersion property. However, this package uses epoxy resin as an insulation layer, and hence its thermal resistance is not sufficient. Also, since expansion coefficient of epoxy resin is small, when it is processed by deep drawing or bent with a small radius of curvature by means of pressing work, the insulation layer tends to generate cracks therein and exfoliate from the metal of the substrate, proving that it is not sufficiently reliable. After all, processing of this package by deep drawing is basically difficult, and its external size becomes relatively larger compared with the effective internal measurement of the package. Due to the above, this package requires an extra space when it is mounted on other substrates and has thus proved not to be sufficiently usable in high density packaging.

Further, Japanese Patent Publication Hei1-43473 (JP, B2, 1-43473) Gazette filed by Nukui et al. discloses the wiring substrate for mounting electronic parts using a metal board as a support substrate which has a thin metal film formed thereon by means of an ionic engineering deposition method. The support substrate, the organic insulation layer and the thin metal film of the wiring substrate are bent together into a product of a desired form. However, since the conductor layer of this wiring substrate is formed by the ionic engineering method, particular equipment for the process such as sputtering or vacuum evaporation is required, thus posing a problem that the production of the wiring substrate by this method is not easy.

DISCLOSURE OF INVENTION

The present invention has been developed in view of the above problems. An object of the present invention is to provide a small sized and reliable solid printed substrate for mounting electronic parts and a method of manufacturing the same, the solid printed substrate having a good heat dispersion and an electromagnetic wave shielding properties, being able to receive high density wiring and being used in packages which are capable of mounting a number of electronic parts for meeting multiple chips, without having useless spaces, while being able to narrow lead pith distances.

In order to solve the above problems, the present inventor et al. have completed a solid printed substrate for mounting electronic parts having an excellent thermal resistance, good electromagnetic wave shielding and heat dispersible properties and high packaging area efficiency, by using a common copper foil for a conductor layer, stacking the copper foil on the metal board without using adhesives interposing an insulative layer made of thermoplastic polyimide with a large expansion coefficient, further stacking a plurality of copper foil layers interposing thermoplastic polyimide films respectively while processing a circuit on each copper foil layer, and subsequently processing the substrate through bending or drawing operation.

In other words, the solid printed substrate of the present invention uses a metal base substrate comprising a metal board and a copper foil layer stacked on the metal board interposing a first insulation layer while having a circuit processed thereon, a collar portion formed in said metal base substrate through bending or drawing operation, wherein, said metal base substrate has multilayered structure consisting of a plurality of copper foil layers and second insulative layers for insulating each of said plurality of copper foil layers, at least two layers of said plurality of copper foil layers are mutually electrically connected, a contact interface of said first insulative layer to said copper foil layer and a contact interface of said first insulation layer to said metal board, are both made of at least thermoplastic polyimide, said second insulative layer made of at least thermoplastic polyimide, area of an opening portion formed by the bending or drawing operation is approximately equal to area of a bottom portion formed by the bending or drawing operation, and a lead portion, which is a part of said copper foil layer and serves as a connection with other circuit substrate, is formed in said collar portion so as to keep a tip of said lead portion off an end of the collar portion.

Since the solid printed substrate of the present invention is of multilayered structure with a metal board disposed on the back thereof, the substrate allows high density packaging thereon having a good heat dispersive and an electromagnetic wave shielding properties. In addition, this solid printed substrate has deep drawing structure, it will occupy a small area when mounted on other substrate. Further, since the inner lead portion (wiring conductor) to be formed within the bottom of the solid printed substrate can be arranged close to the electronic parts to be mounted, bonding wires of short length are sufficient for packaging electronic parts. Owing to these matters, miniaturization in package form and high speed operation can further be attained when compared with the case which employs lead frames or the like now used in conventional chip carriers. Furthermore, since the lead portion to be used for connection with other substrate is built on the metal board interposing an insulation layer, even when the pitch distance of the outer lead is narrowed, there will occur no problem with reference to the strength.

Although the metal board of the solid printed substrate of the present invention is generally 0.05 to 2.0 mm in thickness, preferably a board made of aluminum, copper alloy such as nickel silver or brass, copper, copper clad invar, stainless steel, iron, silicon steel and aluminum processed by electrolytic oxidation or the like, each being 0.1 to 1.5 mm thick, can be used. With the metal board thinner than 0.05 mm thick, the flatness of the surface is degraded after final machining and hence workability of wire bonding in packaging of electronic parts is lowered. Further, with the metal board thicker than 2.0 mm, though simple bending work can be executed without any obstacle, It becomes difficult to process the board by deep drawing.

As the thermoplastic polyimide to be used in the present invention, there are commodities such as Larc-TPI and New TPI of MITSUI TOATSU CHEMICALS INC., Upimol of UBE INDUSTRIES, LTD., PIS and Sixef-33 of HOECHST INC., Ultem of GENERAL ELECTRIC CO., and Torlon of AMOCO PERFORMANCE PRODUCTS INC. Further, the thermoplastic polyimide which can be obtained by the reaction between diamine and tetracarboxylic dianhydride is also usable. They are as shown in the following. For the diamine, there are meta position diamine, for example, 3,3'diaminobenzophenone, 1,3-bis (3-aminophenoxy) benzen, 4,4'-bis (3-aminophenoxy) biphenyl, 2,2-bis [4-(3-aminophenoxy) phenyl] propane, 2,2-bis [4-(3-aminophenoxy) phenyl]-1,1,1,3,3,3-hexafluoropropane, bis [4- (3-aminophenoxy) phenyl] sulfide, bis [4-(3-aminophenoxy) phenyl] ketone, bis [4-(3-aminophenoxy) phenyl] sulfone, and these are used independently or in the form of a mixture of two or more types. As a tetracarboxylic dianhydride, there are, for example,. ethylene tetracarboxylic dianhydride, cyclopentane tetracarboxylic dianhydride, pyromelitic dianhydride, 3,3',4,4'-benzophenone tetracarboxylic dianhydride, 2,2',3,3'-benzophenone tetracarboxylic dianhydride, 3,3',4,4'-biphenyl tetracarboxylic dianhydride, 2,2',3,3'-biphenyl tetracarboxylic dianhydride, 2,2-bis (3,4-dicarboxyphenyl) propane dianhydride, 2,2-bis (2,3-dicarboxyphenyl) propane dianhydride, bis (3,4-dicarboxyphenyl) ether dianhydride, bis (3,4-dicarboxyphenyl) sulfone dianhydride, 1,1-bis (2,3-dicarboxyphenyl) ethane dianhydride, bis (2,3-dicarboxyphenyl) methane dianhydride, bis (3,4-dicarboxyphenyl) methane dianhydride, 2,3,6,7-naphtalene tetracarboxylic dianhydride, 1,4,5,8-naphtalene tetracarboxylic dianhydride, 1,2,5,6-naphtalene tetracarboxylic dianhydride, 1,2,3,4-benzene tetracarboxylic dianhydride, 3,4,9,10-perylene tetracarboxylic dianhydride, 2,3,6,7-anthracene tetracarboxylic dianhydride, 1,2,7,8-phenanthrene tetracarboxylic dianhydride, and these are used independently or in the form of a mixture of two or more types. The above diamine and tetracarboxylic dianhydride are mixed in the solution for a primary reaction to produce polyamide acid varnish, which is further subjected to dehydrating condensing reaction to produce thermoplastic polyimide.

The thermoplastic polyimide thus obtained and whose main chain is of imide structure, having the glass transition temperature ($T_g$) in the range of 160° to 350° C. with its breaking elongation percentage of 30% or more which is measured in accordance with the method stipulated in JIS (Japanese Industrial Standard)-C2318, is best used in the present invention. It is not desirable to have the glass transition temperature of not more than 160° C., because in such a case the thermal reliability is degraded during the packaging process including gold (Au) wire bonding process. It is also not desirable to have the glass transition temperature not less than 350° C., because in this case the bonding strength between the metal board and copper foil is lowered. Further, when the elongation percentage of the thermoplastic polyimide is less than 30%, there sometimes occurs undesirable defects, particularly exfoliation between the metal and polyimide or cracks in the insulation layer during machining operation such as bending or drawing.

In the present invention, it is also possible to use, as the insulation layer, the mixture of the thermoplastic polyimide resin and the thermosetting resin or other thermoplastic resin, for example, the thermosetting resin such as epoxyphenol, bismaleimide, and thermoplastic resin such as polyamideimide, polysulfone, polyparabanic acid and polyphenylene sulfide. In addition, it is also possible to use as the insulation layer a sheet-formed member made of a heat-resistant film such as polyimide, polyamideimide, aramide, polyether ketone by applying polyamide acid varnish on both sides thereof and subsequently heating it to turn the polyamide varnish into imide. Further, it is also possible to use thermoplastic polyimide varnish as the insulation layer by making the varnish into a form of the film by casting or coating and successively drying it in the same manner as the film formation method. Furthermore, it is possible to form an insulation layer by applying the above polyimide acid varnish or thermoplastic polyimide on the back of the metal board and/or copper foil for use, and heating, drying and stacking it for completion.

It is acceptable to add inorganic fillers to the insulation layer in the range which do not harm the machinability of such as bending or drawing in order to improve the heat dispersibility of the insulation layer. As inorganic fillers, there are alumina, silica, silicon carbide, aluminum nitride and boron nitride or the like.

As for copper foils, such as electrolytic copper foils or rolled copper foils on the market easily available with relatively low price are generally used.

For bonding the metal board, the insulation layer, and the copper foil layer with each other, a hot roll method or hot press method is generally used. Particularly in the solid printed substrate of the present invention, copper foil layers and insulation layers are stacked in multilayers. For forming multilayered structure of this like, there is, for example, a build-up method or a sheet subassembly method. In the build-up method, respective insulation layers and copper foil layers are stacked alternately on the metal board into multilayers. While, in the sheet subassembly method, only an insulation layer and two copper foil layers are stacked into a sheet with the copper foil on both sides thereof, and bond this sheet onto the metal board interposing another insulation sheet. By repeating these methods, multilayered structure is realized.

According to the manufacturing method of the solid printed substrate of the present invention, a penetrated hole to be used for interlayer bonding is formed by a laser beam from the excimer laser or by etching which uses an alkaline solution. In case of using the excimer laser, by adjusting the power of the laser, a penetration hole with a sharp outline can be exactly formed without eroding the copper foil layer where expected to remain intact. It is also possible to obtain a penetration hole with a sharp contour without eroding the copper foil layer when the alkaline solution is used.

As an example of the excimer laser, there is, for example, a Kr/F system. As the alkaline solution, there is, for example, an alcohol solution of potassium hydroxide or sodium hydroxide, and further a hydrazinc compound may be added thereto according to cases.

In order to electrically connect between copper foil layers through the penetration hole, a method using such as plating, soldering, conductive paste which is usual in the manufacturing method of the common printed wiring board can be applied. Also, it is possible to use a wire bonding method for connecting between the above copper foil layers.

Machining operation in the present invention such as drawing or bending can be executed by pressing work using normal type dies. For the purpose of protecting the conductor portion of the solid printed substrate during the drawing operation, it is allowable to apply resin coating on the surface of the die or provide a cavity portion in the die adapting to the configuration of the pattern. In the present invention, since the insulation layer is provided having elongation percentage of not less than 30%, even deep drawing or bending operation with a small radius of curvature does not require particular processing such as hot working or making the insulation layer swell by applying solvent thereto.

In the present invention, it is important to machine the work so that the tips of lead portions are 50 µm off the end of the collar which is formed on the periphery of the opening of the solid printed substrate. Here, the lead portion is a part of the copper foil layer which extends up to the collar portion for the purpose of connecting to other circuit substrate. If the distance between the tip of the lead portion and the end of the collar is made less than 50 µm, then unfavorably short circuit tends to occur between the lead portion and the metal board on the back of the substrate due to wrapping around of the solder when this solid printed substrate is mounted on other substrate.

The shape of the collar portion is selectable according to circumstances, however, it is desirable to select U shape from view point of workability. When the collar portion is U-shaped, it is preferable to process the collar so as to keep the inside radius of curvature in the range of 0.1 to 0.5 mm in order to enhance the connection reliability and protect the insulation layer and wiring conductor (copper foil) from being damaged. In an embodiment described below, the radius of curvature is made 1.0 mm. Due to the similar reason, with reference to the corner portion which constitutes a part of the bottom of the solid printed substrate, It is preferable to make the inside radius of curvature in the range of 0.1 to 10 mm. In the embodiment described later, the radius of curvature is made 1.0 mm.

In the electronic circuit package of the present invention, one or some combinations of silicone resin, epoxy resin or bismaleimide resin or the like can be used as the sealing organic resin. In order to adjust the linear expansion coefficient which may be influenced by heat, an inorganic filler can be used by mixing into the sealing resin. Further, with reference to the sealing method, any of injection, potting, transfer molding and press forming methods can be used according to circumstances.

BRIEF DESCRIPTION OF DRAWINGS

FIG. 3A–3J are views is a view explaining a manufacturing process of a solid printed substrate according to the build-up method.

FIG. 5 is a typical sectional view showing an example of the interlayer connection made by a wire bonding method.

FIG. 6 is a typical sectional view showing an example of the interlayer connection made by a plating method.

BEST MODE FOR CARRYING OUT THE INVENTION

A preferable embodiment of the present invention will next be described with reference to the drawings.

Figure 1A:
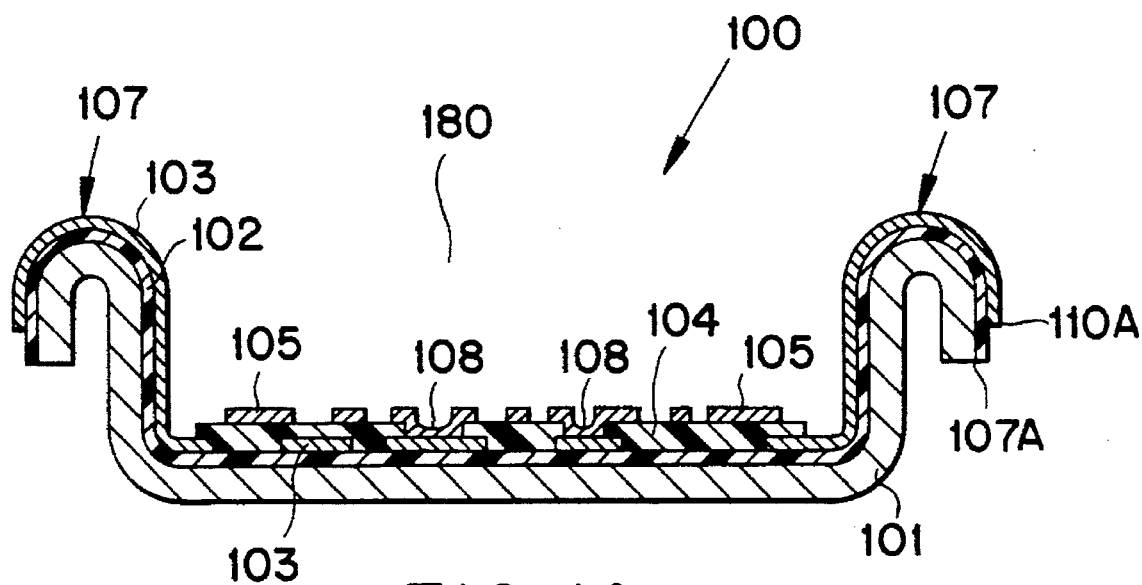
FIG. 1A is a sectional view showing the structure of a solid printed substrate of an embodiment of the present invention.
Figure 1B:
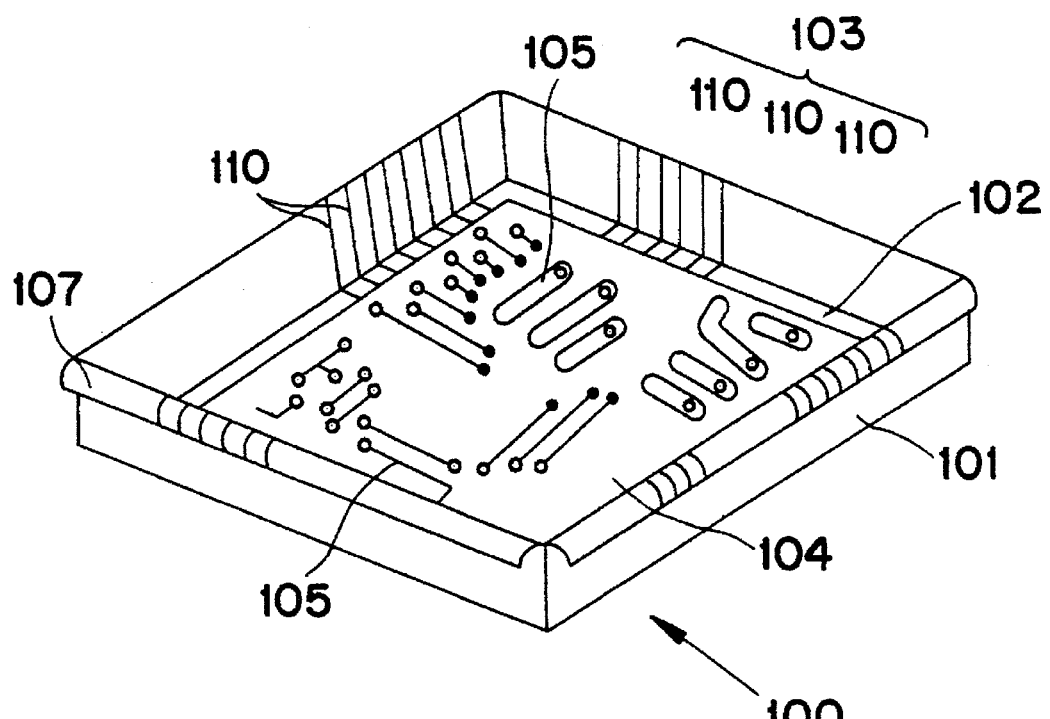
FIG. 1B is an oblique view of the solid printed substrate of FIG. 1A.

A solid printed substrate of an embodiment of the present invention is shown in FIG. 1A and FIG. 1B. Solid printed substrate 100 has two sheets of copper foil layers (wiring conductor) each having a circuit processed thereon. After forming a circuit pattern of the multilayered structure on metal board 101 with a first insulation layer 102, a first wiring conductor 103, a second insulation layer 104 and a second wiring conductor 105, thus formed multilayered structure is processed by bending or drawing into a form of a box including opening 180 to complete solid printed substrate 100. Collar portion 107 is formed for use for connection with other wiring substrate on the periphery of opening 180. In collar portion 107, only the first insulation layer 102 and the first wiring conductor 103 are stacked on metal board 101. In collar portion 107, the first wiring conductor 103 takes a form of a plurality of parallel wiring patterns 110 which extend from the center of solid printed substrate 100 to the periphery thereof having its tip 110A formed to the point more than 50 μm off the end 107A of the collar. The first insulation layer 102 is provided on all the opening 180 side surface of metal board 101.

The first wiring conductor 103 and the second wiring conductor 105 are mutually electrically connected by plated portion 108. In other words, the second insulation layer 104 is removed at the connecting position of the first wiring conductor 103 and the second wiring conductor 105, and instead plated portion 108 is built in the same place. The formation method of the multilayered circuit consisting of insulation layers 102, 104 and conductor layers 103, 105 will be described later. In this case, a copper plate 0.2 mm thick is used for metal board 101. The thermoplastic polyimide with its elongation percentage of 30% and glass transition temperature of 180° C. selected from among LARK-TPI of MITSUI TOATSU CHEMICALS INC. is used for each insulation layer 102, 104. Applied thickness of each insulation layer 102, 104 is 15 μm, and 18 μm thick rolled copper foils are used respectively for wiring conductors 103, 105. Here, the elongation percentage is expressed by the breaking elongation measured by the method stipulated in JIS (Japanese Industrial Standard)—C2318.

The method for mounting electronic parts on solid printed substrate 100 to make an electronic circuit package will next be described.

Figure 2A:
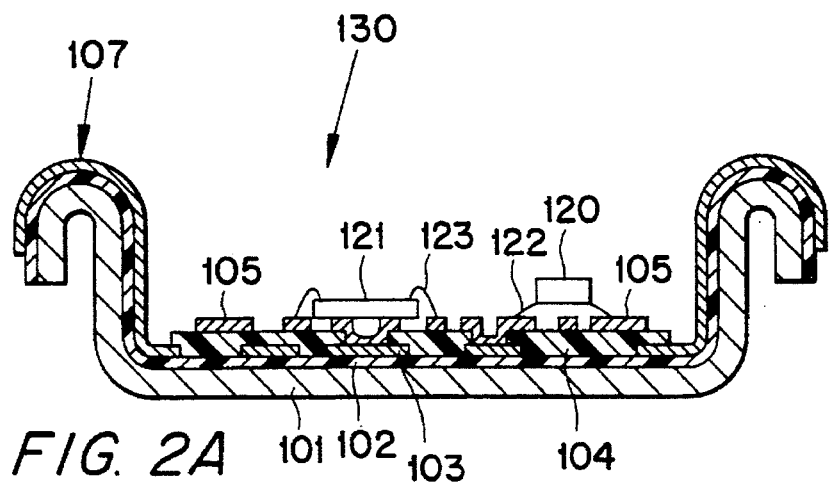
FIG. 2A is a typical sectional view showing the structure of an electronic circuit package obtained by mounting electronic parts onto the solid printed substrate of FIG. 1A.

Electronic circuit package 130 shown in FIG. 2A is made by mounting chip parts 120 and bare chip 121 on the above solid printed substrate 100. Chip parts 120 is of a surface mounting type with lead terminal 122 which extends substantially horizontally from the bottom and soldered onto the surface of the second wiring conductor 105. On the other hand, bare chip 121 is connected to the second wiring conductor 105 by means of bonding wire 123. Recently, some resistances, capacitances, diodes or transistors have been made into respective packages with their periphery serving as terminals without having lead terminals. By placing this kind of electronic parts package on the predetermined position of solid printed substrate 100, and directly soldering the terminal portion on the periphery of the package with the wiring conductor of solid printed substrate 100, the electronic parts of this kind is satisfactorily mounted. Since solid printed substrate 100 which serves as a mounting base plate is of multilayered structure, it is possible to realize a high density packaging with electronic circuit package 130 described above. The method for mounting this electronic circuit package 130 on wiring substrate 140 will next be described. Here, wiring substrate 140 means a substrate on which HIC (Hybrid IC) or LSI (Large Scale Integration) or other electronic parts including electronic circuit package 130 of the present invention are mounted. On the surface of wiring substrate 140, wiring conductor 141 which serves as circuit pattern is formed beforehand.

Figure 2B:
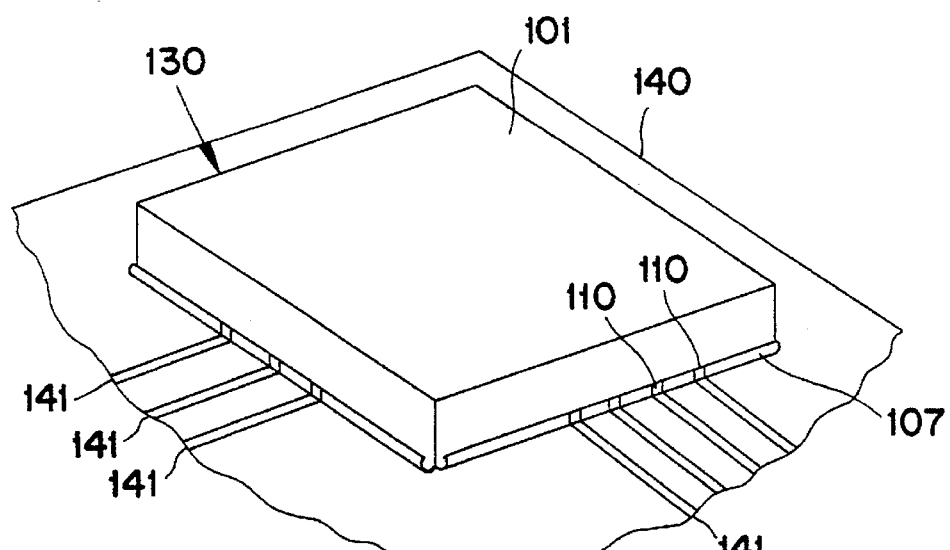
FIG. 2B is an oblique view showing the electronic circuit package of FIG. 2A mounted on a wiring substrate.
Figure 2C:
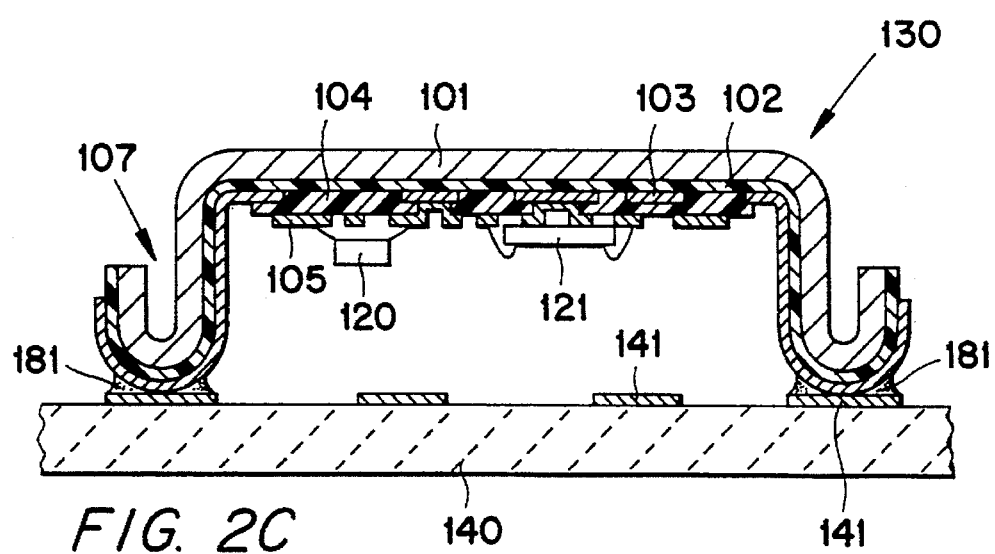
FIG. 2C is a sectional view showing the electronic circuit package of FIG. 2A mounted on a wiring substrate.

As shown in FIG. 2B and FIG. 2C, electronic circuit package 130 is mounted on wiring substrate 140 by placing it with its opening face to wiring substrate 140 and by soldering wiring conductor 141 on wiring substrate 140 and wiring pattern 110 built on collar portion 107. That is, wiring pattern 110 and wiring conductor 141 are joined by means of solder portion 181. Wiring conductor 141 and wiring pattern 110 on collar portion 107 can be connected by applying a solder cream to the surface of wiring conductor 141 and subsequently placing electronic circuit package 130 on wiring substrate 140 so as to position wiring pattern 110 opposite to wiring conductor 141, and heating by using a common reflowing furnace. In order to enhance the electromagnetic wave shielding effect, it is desirable not to allow any clearance between collar portion 107 and wiring substrate 140.

Next, a manufacturing process of solid printed substrate 100 will be described. Solid printed substrate 100 is manufactured by mounting the first and second insulation layers 102, 104, the first and second wiring conductors 103; 105, and then by bending or drawing metal board 101 together with these insulation layers 102, 104, wiring conductors 103, 105 into a desired form. In the above process, circuit formation is already finished prior to bending or drawing operation. A method of forming a multilayered circuit pattern consisting of respective insulation layers 102, 104 and wiring conductors 103, 105 will first be described, starting with a build-up method referring to FIG. 3A–3J.

With reference to the build-up method, one insulation layer and one wiring conductor composed of a copper foil is stacked and this combination is prepared until it reaches the number of the wiring conductors. Then they are stacked and bonded sequentially on metal board to complete the multilayered substrate. In this case, metal board 101 is first prepared with the first insulation layer 102 and the first wiring conductor 103 bonded thereon. Until then, a circuit has been processed on the first wiring conductor 103 by a publicly known method to make the wiring conductor 103 a circuit pattern. Further, in this case, a combination of the second insulation layer 104 and the second wiring conductor 105 is prepared as shown in FIG. 3A, or a combination of the second insulation layer 104 and copper loll layer 151 is prepared as shown in FIG. 3A or 3B. Copper foil layer 151 is equivalent to the second wiring conductor 105 which is in the state of before processing electrical circuit, and provided on all the upper surface of the second insulation layer 104. On the second wiring conductor 105 shown in FIG. 3A, an electrical circuit has already been processed. The difference between states (b) and (c) is that, whether hole 152 which penetrates the second insulation layer 104 and copper foil layer 151 is provided at the position where the first and second wiring conductors 103 and 105 are to be mutually connected [case of FIG. 3C], or not [case of FIG. 3B]. In case of FIG. 3A, hole 152 is also provided at the position for mutual connection of wiring conductors 103 and 105.

From FIG. 3A by bonding the matter of the second insulation layer 104 side onto the matter of metal board 101 side by means of hot pressing, a matter shown in FIG. 3G, that is, the matter in which the first and second wiring conductors 103, 105 are stacked without interlayer connection, can be obtained. Hot pressing is conducted under the condition of inert gas environments or vacuum and at a temperature of 200°. Since hole 152 is already prepared at the position of the interlayer connection exposing the first wiring conductor 103 at the bottom of hole 152, the interlayer connection can be achieved by filling conductive paste 153 into hole 152 and then drying for solidification—state (h). Further, for producing multilayered structure, it is enough only to repeat the above operation. Still further, it is also applicable to fill solder paste into hole 152 to form a solder layer in the hole by means of reflow heating.

As shown in FIG. 3B, by bonding the matter of the second insulation layer 104 side onto the matter of metal board 101 side by means of hot pressing under the condition of inert gas environments or vacuum and at a temperature of 200° C., a matter shown in FIG. 3D, that is, the matter in which the second insulation layer 104 and copper foil layer 151 are stacked on the first wiring conductor 103, is obtained. Here, by processing an electrical circuit on copper foil layer 151, the second wiring conductor 105 is formed—see FIG. 3F. In this arrangement, since the hole for interlayer connection has not been perforated in the second insulation layer 104, hole 152 is perforated in the second insulation layer 104 at the position of interlayer connection. By performing the above process, the matter shown in FIG. 3G is obtained, and hence the successive processes should be followed in the same manner to complete the interlayer connection.

As shown in FIG. 3C, by bonding the matter of the second insulation layer 104 side onto the matter of metal board 101 side by means of hot pressing under the condition of inert gas environments or vacuum at a temperature of 200° C. a matter shown in FIG. 3E, that is, the matter in which the second insulation layer 104 and copper foil layer 151 are stacked sequentially on the first wiring conductor 103, is obtained. At this time, hole 152 has already been perforated at the position of interlayer connection. By processing the electrical circuit on copper foil layer 151, then the substrate is built up as shown in FIG. 3C, and thereafter the process should be repeated in the same way as above to complete the interlayer connection.

When plating is applied to the substrate shown in FIG. 3E, hole 152 is also plated and filled with plated layer 154—see FIG. 3I, thereby electrically connecting the first wiring conductor 103 and copper foil 151. Thereafter, by processing electrical circuit on copper foil 151 to form the second wiring conductor 105, the first and second wiring conductors 103 and 105 are interlayer-connected by plated portion 108—see FIG. 3J. On the other hand, it is possible to reach the matter shown in FIG. 3E from the matter shown in FIG. 3D by providing hole 152 in copper foil 151 and the second insulation layer 104 at the position of interlayer connection. Therefore, it becomes also possible to produce multilayered structure without any difficulty by taking this route.

The sheet subassembly method will next be described with reference to FIGS. 4A–4E. With this method, the first and second copper foil layers 161, 162 are first formed respectively on both sides of the second insulation layer 104—see FIG. 4A. Subsequently, hole 163 is formed at the position of interlayer connection so as to penetrate each copper foil layer 161, 162 and the second insulation layer 104—see FIG. 4B. Then apply through-hole plating to hole 163 to form plated layer 164 on the side wall of hole 163 in order to shortcircuit both copper foil layers 161 and 162—see FIG. 4C. Next, electrical circuit is processed on each copper foil layer 161, 162 to form the first and second wiring conductors 103 and 105—see FIG. 4D. These are then processed by hot pressing under the condition of inert gas environments or vacuum at a temperature of 200° C. to bond metal board 101 and the matter of the second insulation layer 104 side interposing the first insulation layer 102, thus completing the multilayered structure—see FIG. 4E. In this case, interlayer connection is achieved by through-hole plating.

The method of forming an electrical circuit of multilayered structure has been described above. In each of the above circuit forming methods, it is indispensable to bore a hole in the insulation layer or the copper foil layer. Though there is a machining method for hole making which uses a drill of the conventional type, use of drill sometimes damages the lower layer wiring conductor when drilling is applied to the board after it is multilayered. For example, when the substrate of see FIG. 3F is drilled to make a hole to shift to state the matter of FIG. 3G, the first wiring conductor 103 which is at the bottom of hole 152 is inevitably eroded by drilling and consequently there occurs probability of insufficient interlayer insulation.

In order to avoid above defects, there is a boring method which uses a laser beam from excimer laser or a method which etches an insulation layer by means of alkaline solution. As an example of excimer laser, there is such as laser of Kr/F system (transmission wavelength 248 nm, 486 nm). By using excimer laser, it becomes possible to make a hole of clear outline in polyimide used as the insulation layer. Further, when a matter of three layer sandwich structure comprising a copper foil layer, insulation layer and another copper foil layer is perforated, it becomes possible, by controlling the laser power, to make a hole in such a way that a hole of clear outline is made in one copper foil layer and the insulation layer while leaving the other copper foil layer intact without any hole or a cavity formed thereon.

In the present invention, since a material of the polyimide system is used as an insulation layer, it is possible to process the insulator by etching by means of alkaline solution. Hole making by the etching process is efficient because a plurality of holes can be made by the process at the same time. As for the insulation layer which is exposed but of which etching is not required, it is enough to apply some resist layer to the surface of the insulation layer before etching is applied thereto. In case of alkaline etching, since copper foil layers or wiring conductors made of copper foils are not etched, it is possible to make holes only in insulation layers. It is practical to use the etching solution of publicly known composition such as the alcohol solution of potassium hydroxide or sodium hydroxide, and hydrazinc compounds may also be added thereto before use at need. As describe above, after constructing a multilayered substrate which has an electrical circuit already prepared thereon, process it into a desired shape by machining such as bending or drawing to complete solid printed substrate 100. Machining of the substrate will next be described.

In the present embodiment, the pressing method is applied by using dies of normal type for machining of the substrate. In this case, there is no need of hot working or making each insulation layer 102, 104 swell by solvent. Processing by deep drawing should be carried out so as to make the bottom portion area and opening portion area of solid printed substrate 100 become substantially equal to each other. The inside radius of curvature of the corner in the periphery of the bottom portion of solid printed substrate 100 is made 1.0 mm. Collar portion 107 is made to a U-shape and the inside radius of curvature of the U-shaped portion is made 1.0 mm.

Further, surface accuracy of the opening face, that is, the difference between the height of each collar 107 on four sides of solid printed substrate 100 is arranged so as to be not more than 0.5 mm by machining in order to secure the connection with wiring conductor 140. Still further, with reference to the surface of the circuit pattern to be made on the bottom of the substrate, its surface accuracy, that is, the difference between heights of the unevenness is made not to exceed 0.5 mm in order to meet the requirements of the high density packaging of electronic parts. It is not difficult for the person skilled in the art to perform bending or drawing operation of the substrate with the accuracy of the grade stipulated above.

Another embodiment of the solid printed substrate of the present invention will next be described.

An embodiment shown in FIG. 5 illustrates the solid printed substrate in which a wire bonding method is used for interlayer connection instead of a plating method. Penetration hole 152 is formed in the second insulation layer 104 and the first wiring conductor 103 is exposed at the bottom of hole 152. The second wiring conductor 105 has a wiring pattern processed so as to surround hole 152, and the first and second wiring conductors 103, 105 are mutually connected by bonding wire 170 which passes through hole 152. When wire bonding operation is applied, it should be conducted after finishing the machining process.

Figure 4A:
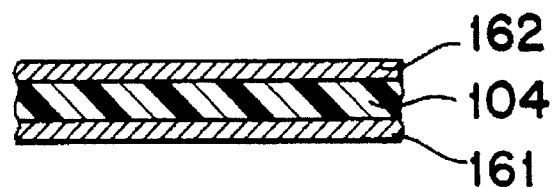
FIG. 4A–4E are views is a view explaining a manufacturing process of a solid printed substrate according to the sheet subassembly method.
Figure 4B:
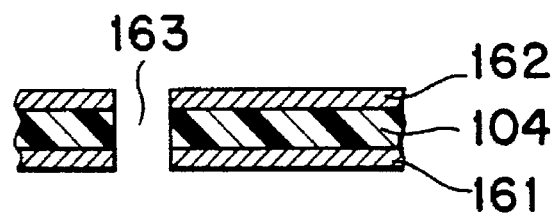
Figure 4C:
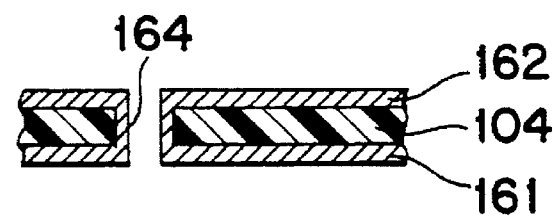
Figure 4D:
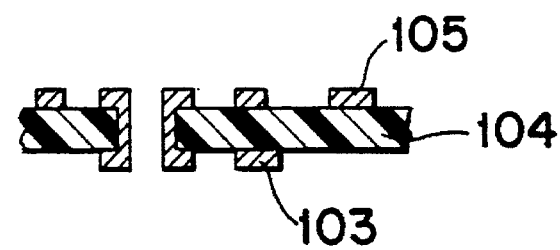
Figure 4E:
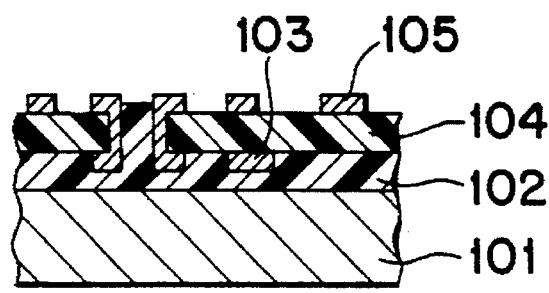

In the embodiments shown in the above FIG. 1A, FIG. 1B, or FIG. 5, the wiring conductor which extends to collar portion 107 is the first wiring conductor 103, that is, the conductor arranged on the side closest to metal board 101. However, the wiring conductor which extends to collar portion 107 is not limited to this. In solid printed substrate 100B shown in FIG. 6, it is structured that the second wiring conductor 105, namely, the wiring conductor on the upper layer side is extended to collar portion 107. When the multilayered structure is built by the above sheet subassembly method, since the first and second wiring conductors 103, 105 are formed by processing circuits on both sides of the second insulation layer 104 as shown in FIG. 4D and E, removal of the second insulation layer 104 becomes indispensable in order to expose the first wiring conductor 103 at collar portion 107. On the other hand, since the uppermost wiring conductor (here, the second wiring conductor 105) is exposed, it is unnecessary to remove the insulation layer to make this wiring conductor extend to collar portion 107.

Figure 7A:
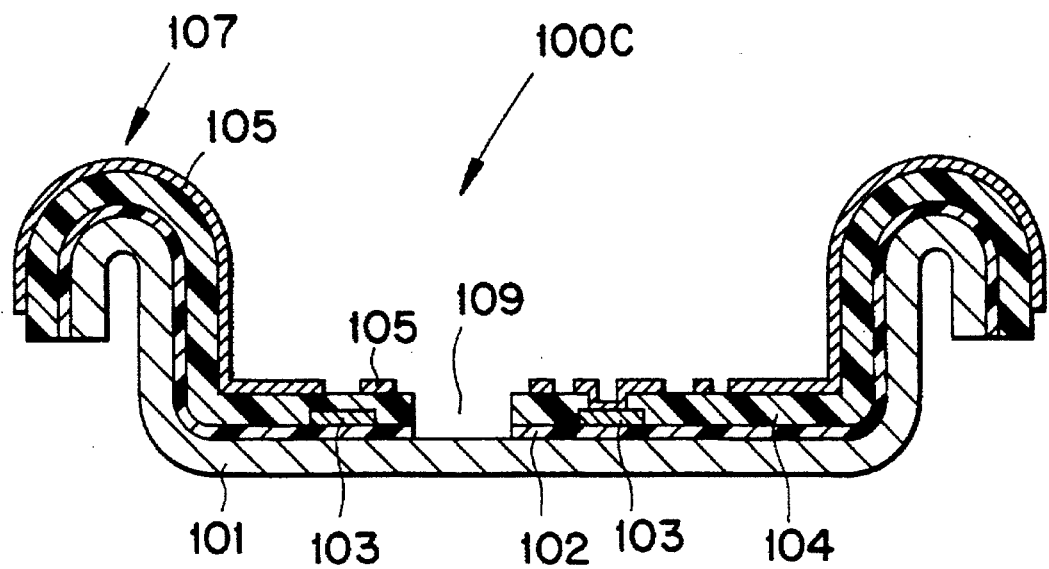
FIG. 7A is a typical sectional view showing an example of the structure in which an insulation layer is removed at the position where electronic parts are mounted.
Figure 7B:
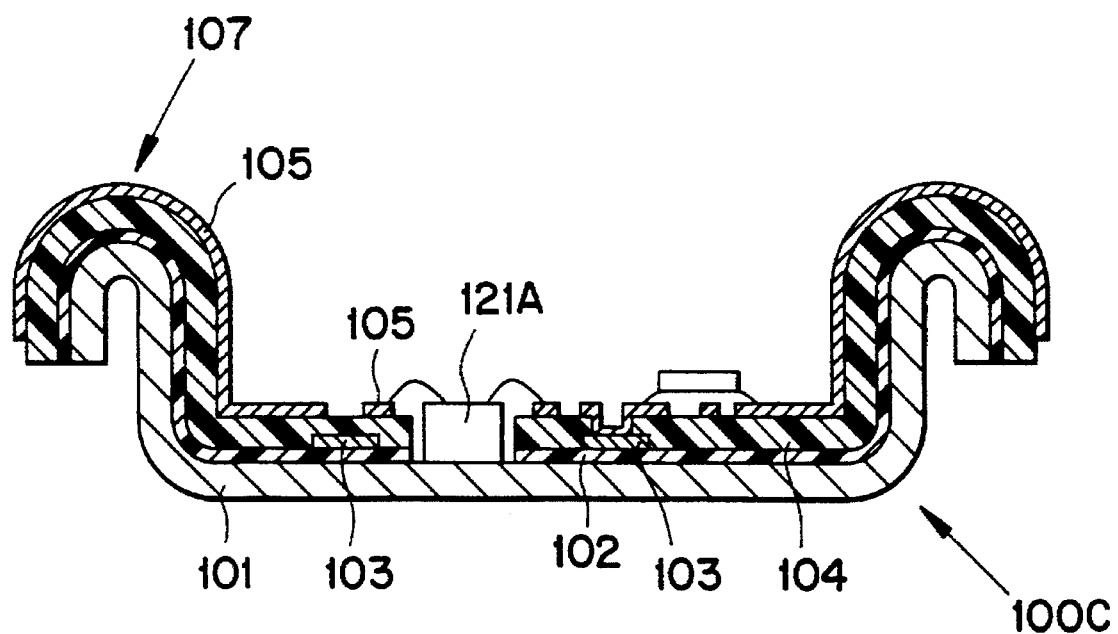
FIG. 7B is a typical sectional view showing an example in which electronic parts are mounted on the solid printed substrate of FIG. 7A.

In solid printed substrate 100C shown in FIG. 7A, each of insulation layers 102, 104, wiring conductors 103, 105 is removed and metal board 101 is exposed in a part (exposed portion 109) of the bottom of the solid printed substrate. Solid printed substrate 100C is suitable to the case which requires to mount a power device of a relatively large heating value while having a proper heat dispersion characteristic. As shown in FIG. 7B, power device 121A is directly mounted on metal board 101 at exposed position 109 by using such as solder or silver paste.

Figure 8A:
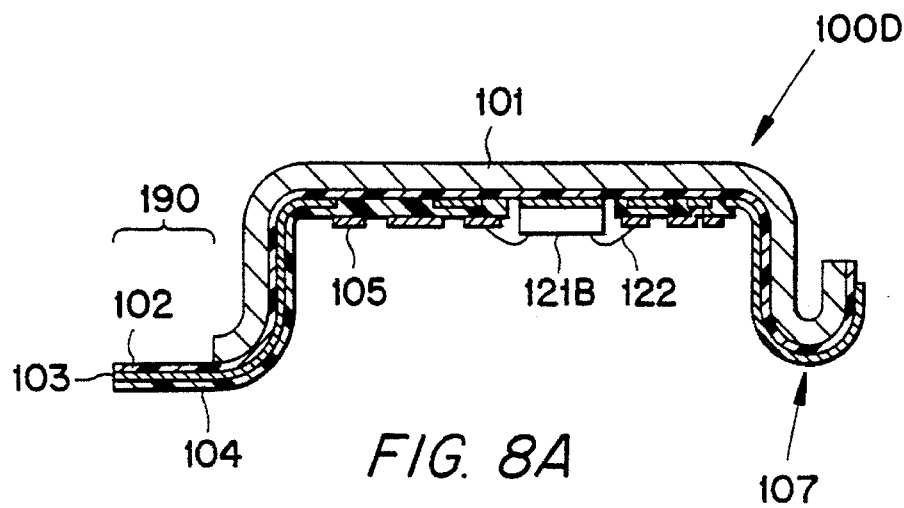
FIG. 8A is a typical sectional view showing an example in which a flat cable is extended for connection with other substrate.
Figure 8B:
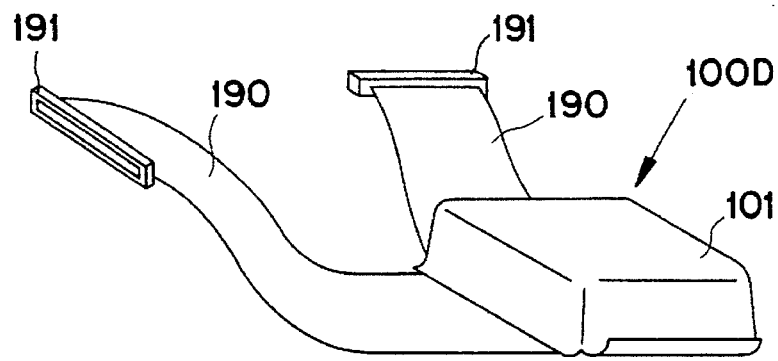
FIG. 8B is an oblique view showing the state in which a connector is attached to the end of the flat cable portion.

In solid printed substrate 100D shown in FIG. 8A, it is structured that the first and second insulation layers 102, 104 and the first wiring conductor 103 are extended outwardly from the main body of the solid printed substrate, that is, outwardly over the periphery of metal board 101. The portion extended outwardly over the periphery of metal board 101 constitutes flat cable 190. As shown in FIG. 8B, by attaching connector 191 to the end of flat cable 190, it becomes possible to electrically connect this solid printed substrate 100D with other printed substrate through connector 191. Further, in FIG. 8A, bare chip 121B is disposed at the position where the second insulation layer 104 is removed and the first wiring conductor 103 is exposed, the bare chip being directly mounted on the first wiring conductor 103. Since there is no second insulation layer 104, by mounting bare chip 121B in this way, the heat dispersion characteristic of bare chip 121B is the more improved when compared to the solid printed substrate shown in FIG. 1B.

Figure 9:
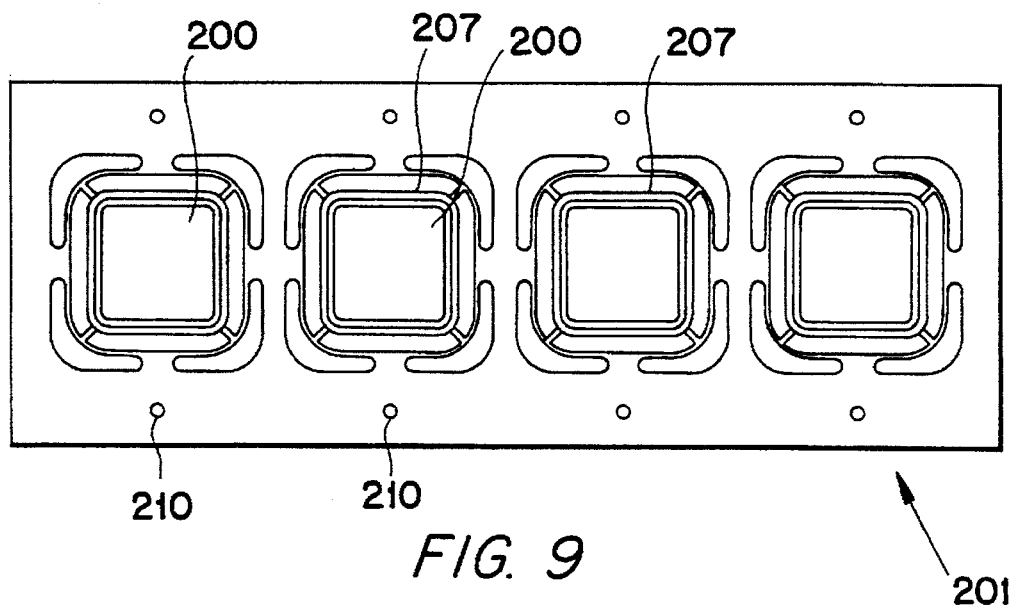
FIG. 9 is a plan showing an example in which a plurality of solid printed substrates are provided successively on the same frame.

In an embodiment shown in FIG. 9, a plurality of solid printed substrates 200 are provided successively on the same frame 201. The structure of each solid printed substrate 200 is the same as that of solid printed substrate 100 in the above embodiment. Each solid printed substrate 200 is structured so as to connect to frame 201 at the four corners of its collar portion 207. Frame 201 is similar to the multilayered metal base substrate in each of the above embodiments, having its circuit pattern processed thereon. Also at the both ends in the width direction of frame 201, pin insertion holes 210 are perforated corresponding to each solid printed substrate 200. Pin insertion hole 210 is used for the purpose of positioning electronic parts when they are mounted on solid printed substrate 200.

By processing a plate-formed frame 201 successively through lance processing, drawing and bending operation by using sequential type dies, solid printed substrates 200 are formed consecutively. By constructing solid printed substrates 200 in this way, electronic parts can be mounted on the solid printed substrate efficiently compared with the case when it is mounted on the independent solid printed substrate, and also it becomes possible to mount electronic parts by using a common mounting machine.

With reference to the electronic circuit package which uses the solid printed substrate of the present embodiment, an example of resin sealing of the mounted electronic parts will next be described. Here, solid printed substrate 100 in FIG. 1A and FIG. 1B will be described as the example.

Figure 10A:
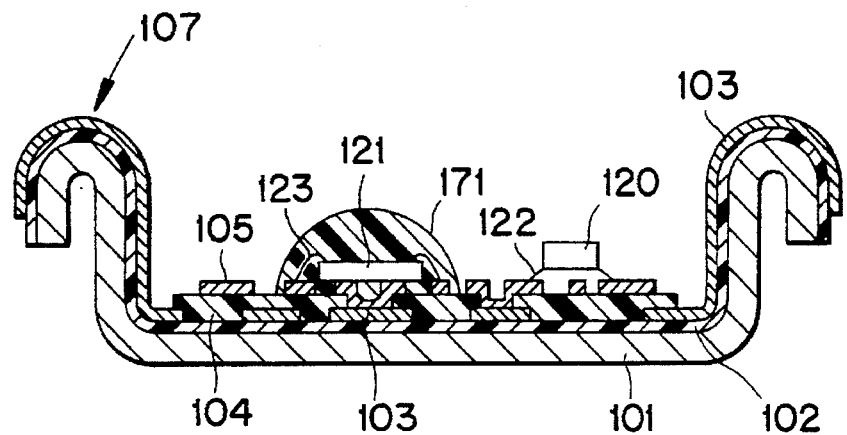
FIG. 10A is a typical sectional view showing the structure of the electronic circuit package sealed with organic resin.

In FIG. 10A, resin sealing with sealing resin 171 is applied by a potting method only to the portion of bonding wire 123 where the trouble such as deterioration of conductivity is most likely to occur due to oxidization.

Figure 10B:
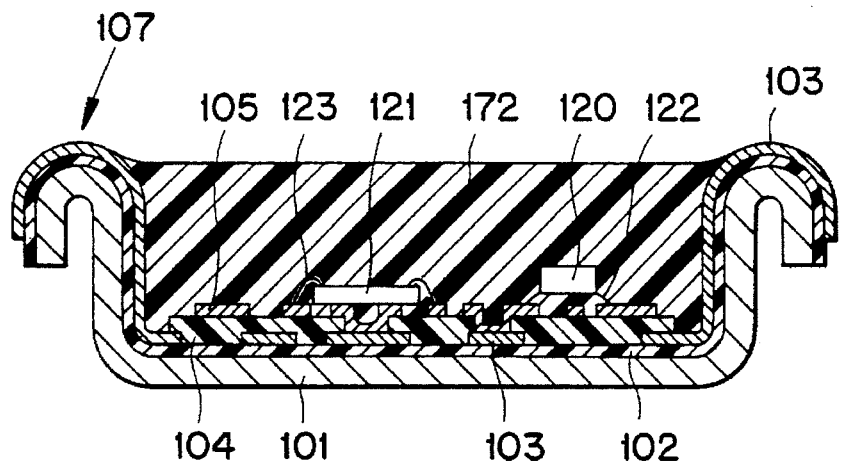
FIG. 10B is a typical sectional view showing the structure of the electronic circuit package sealed with organic resin.

With reference to an example shown in FIG. 10B, the whole electronic circuit to be received in the electronic circuit package is resin sealed with sealing organic resin 172 by an injection method or a transfer molding method. Accordingly, each wiring conductor 103, 105 is also covered by sealing organic resin 172 except collar portion 107.

Figure 10C:
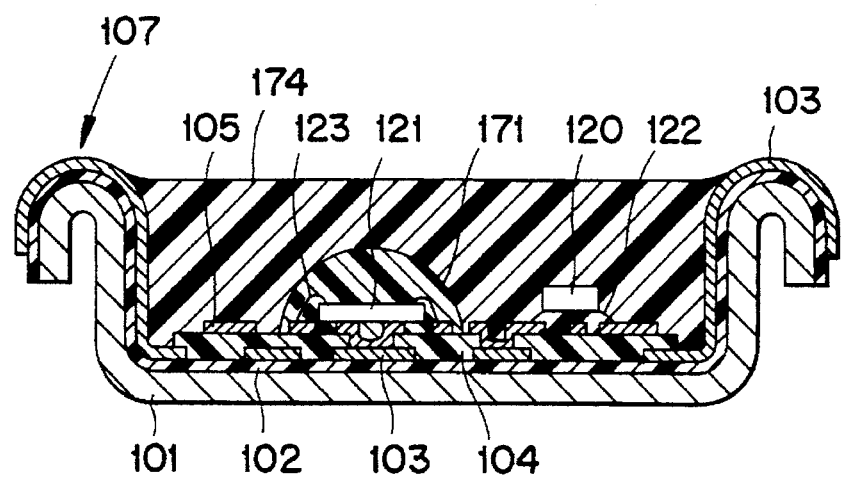
FIG. 10C is a typical sectional view showing the structure of the electronic circuit package sealed with organic resin.

With reference to an example shown in FIG. 10C, a portion of bonding wire 123 which is weak in strength is resin sealed by the potting method with the first sealing resin 173 which shows small contraction during a period of hardening, and subsequently the other portion is resin sealed by the injection method or transfer molding method by using the second organic sealing resin 174 which has excellent weatherproofness. As a result, the whole electronic circuit which is accommodated within the electronic circuit package is resin sealed. As to the portion of bonding wire 123, the resin with small hardening contraction is used to avoid disconnection of the wire which may be caused due to contraction at the time of sealing.

By applying resin sealing like this, deterioration of conductivity can be prevented at the portion where the parts are electrically connected, and secure the reliability for a long period of time when it is used under the severe conditions such as high temperature and high humidity.

The embodiment of the present invention has been set forth in the foregoing description centering on the case in which the wiring conductor (copper foil layer) is of two layers, but it is to be understood that the present invention is not limited thereto. It is possible to construct the wiring conductor with copper foils stacked to three layers or more. Further, the shape of the solid printed substrate is not limited to substantially hexahedrons, but it is also possible to apply, for example, cylindrical forms.

We claim:

1. A solid primed substrate, comprising:

a metal base substrate comprising a metal board, a copper foil layer stacked on said metal board, and a first insulation layer interposed therebetween;

a collar portion made by applying a bending or drawing operation to said metal base substrate; wherein, said metal base substrate has a multilayered structure comprising a plurality of copper foil layers and second insulation layers which insulate respectively each of said plurality of copper foil layers;

at least two layers of said plurality of copper foil layers are mutually electrically connected;

a contact interface of said first insulation layer to said copper foil layer and a contact interface of said first insulation layer to said metal board, are both made of at least a thermoplastic polyimide;

said second insulation layers are made of at least a thermoplastic polyimide;

area of an opening portion formed by said bending or drawing operation is substantially equal to area of a bottom portion formed by said bending or drawing operation; and a lead portion, which is a part of said copper foil layer and serves as a connection with other circuit substrates, is formed in said collar portion so as to keep a tip of said lead portion off an end of said collar portion; and wherein said thermoplastic polyimide at the contact interfaces has an elongation percentage of not less than 30% and a glass transition temperature in the range of 160° C. to 350° C.:

said first insulation layer and said copper foil layer are adhered directly by the thermoplastic polyimide without any adhesives; and said first insulation layer and said metal board are adhered directly by the thermoplastic polyimide without any adhesives.

2. A solid printed substrate according to claim 1, wherein, the tip of said lead portion is spaced not less than 50 μm from the end of said collar portion.

3. A solid printed substrate according to claim 1, wherein, said collar portion having said lead portion is formed substantially U-shaped with its inside radius of curvature in the range of 0.1 mm to 5.0 mm.

4. A solid printed substrate according to claim 1, wherein, inside radius of curvature of a corner portion composing a bottom portion of said solid printed substrate is in range of 0.1 mm to 10.0 mm.

5. A method of manufacturing a solid printed substrate according to claim 1, wherein, a step of electrically connecting at least two layers of said plurality of copper foil layers, comprises:

making a penetration hole in an insulation layer by means of a laser beam from an excimer laser, and subsequently electrically connecting copper foil layers disposed on each side of said insulation layer through said penetration hole.

6. A method of manufacturing a solid printed substrate according to claim 1, wherein, a step of electrically connecting at least two layers of said plurality of copper foil layers, comprising:

making a penetration hole in an insulation layer by means of an etching method using an alkaline solution; and successively electrically connecting copper foil layers disposed on each side of said insulation layer through said penetration hole.

7. An electronic circuit package, comprising:

a solid printed substrate according to any one of claim 1–2 and claims 3–4;

an electronic part mounted on said solid printed substrate; wherein, said electronic part is resin sealed by means of organic sealing resin.

8. An electronic circuit package according to claim 7, wherein, the electronic part comprises at least a bare chip and said bare chip is electrically connected to the solid printed substrate by means of a bonding wire;

only said bare chip and a portion of said bonding wire are resin sealed by a potting method using an organic sealing resin.

9. An electronic circuit package according to claim 7, wherein, inside of said solid printed substrate including the electronic part mounted on said solid printed substrate is resin sealed by an injection method or a transfer molding method using an organic sealing resin.

10. An electronic circuit package according to claim 7, wherein, the electronic part comprises at least a bare chip and said bare chip is electrically connected to the solid printed substrate by means of a bonding wire;

said bare chip and a portion of said bonding wire are resin sealed by a potting method using a first organic sealing resin, and thereafter, inside of said solid printed substrate including the electronic part mounted on said solid printed substrate is resin sealed by an injection method or a transfer molding mounted using a second organic sealing resin.

11. A solid printed substrate according to claim 1, wherein said thermoplastic polyimide is obtained by a reaction between diamine and tetracarboxylic dianhydride.

* * * * *